United States Patent [19]
Christie et al.

[11] Patent Number: 5,668,059
[45] Date of Patent: *Sep. 16, 1997

[54] SOLDER INTERCONNECTION STRUCTURE AND PROCESS FOR MAKING

[75] Inventors: Frederick Richard Christie; Kostas I. Papathomas, both of Endicott; David Wei Wang, Vestal, all of N.Y.

[73] Assignee: International Business Machines Corporation, Armonk, N.Y.

[*] Notice: The term of this patent shall not extend beyond the expiration date of Pat. No. 5,089,440.

[21] Appl. No.: 679,648

[22] Filed: Jul. 12, 1996

Related U.S. Application Data

[60] Division of Ser. No. 59,003, May 6, 1993, and a continuation-in-part of Ser. No. 737,473, Jul. 30, 1991, Pat. No. 5,250,848, which is a division of Ser. No. 624,973, Dec. 10, 1990, Pat. No. 5,089,440, which is a division of Ser. No. 493,126, Mar. 14, 1990, Pat. No. 4,999,699.

[51] Int. Cl.$^6$ ................................................. H01L 21/60
[52] U.S. Cl. .................... 438/118; 438/124; 438/119; 438/612
[58] Field of Search ........................... 437/183, 209, 437/211, 213, 215, 216, 217, 218, 219; 29/840, 841, DIG. 1

[56] References Cited

U.S. PATENT DOCUMENTS

| | | | |
|---|---|---|---|
| 3,949,125 | 4/1976 | Roberts | 428/99 |
| 4,504,283 | 3/1985 | Charvat | 51/298 |
| 4,579,806 | 4/1986 | Schupp et al. | 430/280 |
| 4,604,644 | 8/1986 | Beckham et al. | 29/840 |
| 4,999,699 | 3/1991 | Christie et al. | 251/778 |
| 5,089,440 | 2/1992 | Christie et al. | 437/209 |
| 5,250,848 | 10/1993 | Christie et al. | 257/778 |

*Primary Examiner*—Kevin Picardat
*Attorney, Agent, or Firm*—Pollock, Vande Sande and Priddy

[57] ABSTRACT

Solder interconnection encapsulant, encapsulated structure and method for its fabrication and use, whereby the gap created by solder connections between a carrier substrate and a semiconductor device is filled with a composition obtained from curing a preparation containing a cycloaliphatic polyepoxide and/or curable cyanate ester or prepolymer thereof; filler, e.g., an aluminum nitride or aluminum oxide filler, having a maximum particle size of 31 microns.

24 Claims, 1 Drawing Sheet

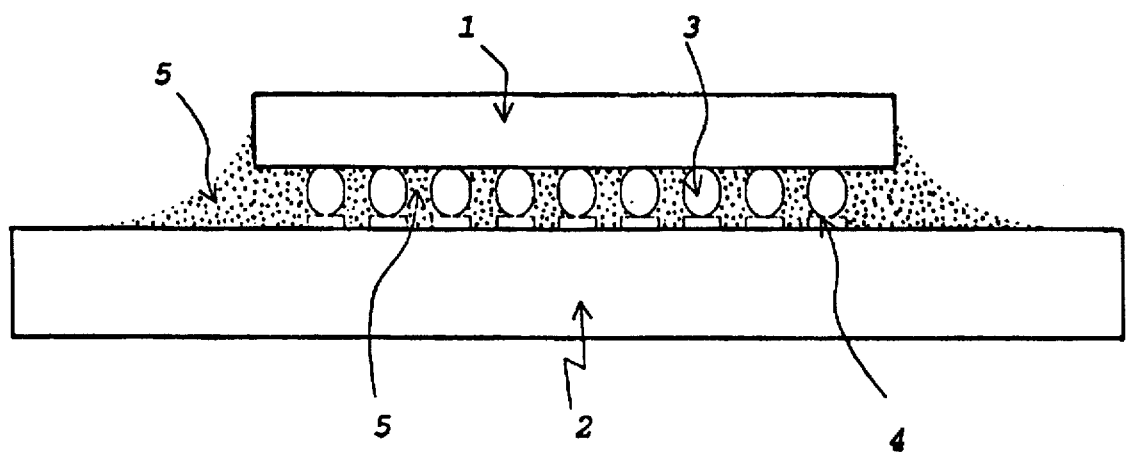

SOLDER INTERCONNECTION STRUCTURE AND PROCESS FOR MAKING

CROSS REFERENCE TO RELATED APPLICATIONS

This is a divisonal of application Ser. No. 08/059,003 filed May 6, 1993 and a continuation-in-part of our commonly assigned U.S. application Ser. No. 07/737,473, filed Jul. 30, 1991, for SOLDER INTERCONNECTION STRUCTURE AND PROCESS FOR MAKING, now U.S. Pat. No. 5,250,848, which was a division of our commonly assigned U.S. application Ser. No. 07/624,973, filed Dec. 10, 1990, now U.S. Pat. No. 5,089,440, issued Feb. 18, 1992, for SOLDER INTERCONNECTION STRUCTURE AND PROCESS FOR MAKING, which was a division of our commonly assigned U.S. application Ser. No. 07/493,126, filed Mar. 14, 1990, now U.S. Pat. No. 4,999,699, issued Mar. 12, 1991, for SOLDER INTERCONNECTION STRUCTURE AND PROCESS FOR MAKING.

DESCRIPTION

1. Technical Field

The present invention is concerned with interconnection structures for joining an integrated semiconductor device to a carrier substrate and particularly to a structure for forming solder interconnection joints that exhibit improved fatigue life and stability. The present invention is especially concerned with so-called "controlled collapse chip connection" or "C4" that employs solder-bump interconnections. Such is also referred to as the face down or flip-chip bonding. The present invention is also concerned with a flowable material for making the interconnection structure, and with a method of making the interconnection structure.

2. Background

Controlled collapse chip connection (C4) or flip-chip technology has been successfully used for over twenty years for interconnecting high I/O (input/output) count and area array solder bumps on the silicon chips to the base ceramic chip carriers, for example alumina carriers. The solder bump, typically a lead/tin alloy such as 95 Pb/5 Sn alloy, or a lead/indium alloy, such as 50 Pb/50 In, provides the means of chip attachment to the ceramic chip carrier for subsequent usage and testing. For example, see U.S. Pat. Nos. 3,401,126 and 3,429,040 to Miller and assigned to the assignee of the present application, for a further discussion of the controlled collapse chip connection (C4) technique of face down bonding of semiconductor chips to a carrier. Typically, a malleable pad of metallic solder is formed on the semiconductor device contact site and solder joinable sites are formed on the conductors on the chip carrier.

The device carrier solder joinable sites are surrounded by non-solderable barriers so that when the solder on the semiconductor device contact sites melts, surface tension of the molten solder prevents collapse of the joints and thus holds the semiconductor device suspended above the carrier. With the development of the integrated circuit semiconductor device technology, the sizes of individual active and passive circuit elements and gates have become very small, the number of circuit elements and gates in the integrated circuit has increased dramatically, and the integration of multiple functions on a single chip, with increasing numbers of circuits per chip, has increased explosively. This results in significantly larger chip sizes with larger numbers of I/O terminals. This trend will continue and will place increasingly higher demands on chip joining technology. An advantage of solder joining a device to a substrate is that the I/O terminals can be distributed over substantially the entire top surface of the semiconductor device. This allows an efficient use of the entire surface, which is more commonly known as area array bonding.

Usually the integrated circuit semiconductor devices are mounted on supporting substrates made of materials with coefficients of thermal expansion that differ from the coefficient of thermal expansion of the material of the semiconductor device, i.e. silicon. Normally the device is formed of monocrystalline silicon with a coefficient of thermal expansion of $2.5 \times 10^{-6}$ per °C. and the substrate is formed of a ceramic material, typically alumina with a coefficient of thermal expansion of $5.8 \times 10^{-6}$ per °C. or an organic substrate which can be either rigid or flexible material having a coefficient of thermal expansion ranging from $6 \times 10^{-6}$ to $24.0 \times 10^{-6}$ per °C. In operation, the active and passive elements of the integrated semiconductor device inevitably generate heat resulting in temperature fluctuations in both the devices and the supporting substrate since the heat is conducted through the solder bonds. The devices and the substrate thus expand and contract in different amounts with temperature fluctuations, due to the different coefficients of thermal expansion. This imposes stresses on the relatively rigid solder terminals.

The stress on the solder bonds during operation is directly proportional to (1) the magnitude of the temperature fluctuations, (2) the distance of an individual bond from the neutral or central point (DNP), and (3) the difference in the coefficients of thermal expansion of the material of the semiconductor device and the substrate, and inversely proportional to the height of the solder bond, that is the spacing between the device and the support substrate. The seriousness of the situation is further compounded by the fact that as the solder terminals become smaller in diameter in order to accommodate the need for greater I/O density, the overall height decreases.

More recently, an improved solder interconnection structure with increased fatigue life has been disclosed in U.S. Pat. No. 4,604,644 to Beckham, et al. and assigned to the assignee of the present application, disclosure of which is incorporated herein by reference. In particular, U.S. Pat. No. 4,604,644 discloses a structure for electrically joining a semiconductor device to a support substrate that has a plurality of solder connections where each solder connection is joined to a solder wettable pad on the device and a corresponding solder wettable pad on the support substrate, dielectric organic material disposed between the peripheral area of the device and the facing area of the substrate, which material surrounds at least one outer row and column of solder connections but leaves the solder connections in the central area of the device free of dielectric organic material.

The preferred material disclosed in U.S. Pat. No. 4,604,644 is obtained from a polyimide resin available commercially and sold under the trademark AI-10 by Amoco Corporation. AI-10 is formed by reacting a diamine such as p,p'diaminodiphenylmethane with trimellitic anhydride or acylchloride of trimellitic anhydride. The polymer is further reacted with γ-amino propyl triethoxy silane (A1100) or β-(3,4-epoxy cyclohexyl) ethyltrimethoxy silane (A-186) from Dow Corning. The coating material is described in IBM TDB September 1970 P. 825.

The dielectric material is typically applied by first mixing it with a suitable solvent and then dispensing it along the periphery of the device where it can be drawn in between the device and substrate by capillary action.

Although the above techniques have been quite successful, there still remains room for improvement in extending the fatigue life.

SUMMARY OF THE INVENTION

The present invention is concerned with enhancing the fatigue life of C4 solder connections. The present invention provides an encapsulant that exhibits excellent wetting and coverage of the C4 connections as well as the pin heads, circuitry, or vias under the chip that are present. In fact, the present invention makes it possible to achieve complete coverage beneath the chip. The encapsulant employed pursuant to the present invention exhibits even and adequate flow under the semiconductor device as contrasted to prior encapsulants that do not adequately cover the C4 connections, pin heads, circuitry, vias, or solder masks.

In particular, the present invention is concerned with solder interconnection for forming connections between an integrated semiconductor chip and a carrier substrate. The solder interconnection includes a plurality of solder connections that extend from the carrier substrate to electrodes on the semiconductor chip to form a gap between the carrier substrate and the semiconductor device. The gap is filled with a composition obtained from curing a curable composition containing a binder which is a polyepoxide and/or a cyanate ester or prepolymer thereof and a filler. The polyepoxide, cyanate ester and cyanate ester prepolymer employed have viscosities at normal room temperatures (25° C.) of no greater than about 5,000 centipoise. The filler has a maximum particle size of 31 microns. The amount of binder (i.e.—epoxy and/or cyanate ester) is about 80 to about 25 percent by weight of the total of the binder and filler and, correspondingly, the filler is about 20 to about 75 percent by weight of the total of the binder and filler.

In addition, the present invention is concerned with a method of increasing the fatigue life of solder interconnections between a semiconductor device and a supporting substrate. The method includes attaching the chip device to the substrate by a plurality of solder connections that extend from the supporting substrate to electrodes on the semiconductor device to form a gap between the supporting substrate and the semiconductor device. The gap is filled with the above disclosed binder-filler composition and the composition is cured.

SUMMARY OF THE DRAWINGS

The figure is a schematic diagram of a solder interconnection pursuant to the present invention.

BEST AND VARIOUS MODES FOR CARRYING OUT INVENTION

To facilitate understanding of the present invention, reference is made to the figure. In the figure, numeral 1 represents a semiconductor chip joined to the chip carrier 2 by solder bumps 3 mated to pads 4. I/O can be in the form of pins extending and protruding from the carrier 2, with a small portion of the pins protruding from the other side of the carrier for carrying current thereto. Alternatively, I/O can be in the form of connections passing through lead frames or bonding pads. When the carrier is an organic substrate, the pins as such are not required. Instead, electrically conductive circuitry and interconnections would be provided such as at the periphery of substrate for connection to a desired structure. The encapsulant 5 pursuant to the present invention provides for essentially void free encapsulation of the solder connections thereby assuring highly reliable devices and fills the gap forming a uniform fillet around the chip as well as covering the pin heads, circuits, vias, or solder masks under the device (not shown).

The encapsulant composition of the present invention must contain a binder selected from the group of cycloaliphatic polyepoxide, cyanate ester, prepolymer of cyanate ester or mixtures thereof.

The cycloaliphatic type epoxides employed in the preferred resin ingredient in the invention are selected from non-glycidyl ether epoxides containing more than one 1,2-epoxy group per molecule. These are generally prepared by epoxidizing unsaturated aromatic hydrocarbon compounds, such as cyclo-olefins, using hydrogen peroxide or peracids such as peracetic acid and perbenzoic acid. The organic peracids are generally prepared by reacting hydrogen peroxide with either carboxylic acids, acid chlorides, or ketones, to give the compound R—COOOH. These materials are well known, and reference may be made to Byrdson, J., *Plastic Materials*, 1966, 471, for their synthesis and description.

Such non-glycidyl ether cycloaliphatic epoxides are characterized by having a ring structure wherein the epoxide group may be part of the ring or attached to the ring structure. These epoxides may also contain ester linkages. The ester linkages are generally not near the epoxide group and are relatively inert to reactions.

Examples of non-glycidyl ether cycloaliphatic epoxides would include 3,4-epoxycyclohexylmethyl-3,4-epoxycyclohexane carboxylate (containing two epoxide groups which are part of the ring structures, and an ester linkage), vinylcyclohexane dioxide (containing two epoxide groups, one of which is part of a ring structure; 3,4-epoxy-6-methylcyclohexylmethyl-3,4-epoxycyclohexane carboxylate and dicyclopentadiene dioxide, having the following respective structures:

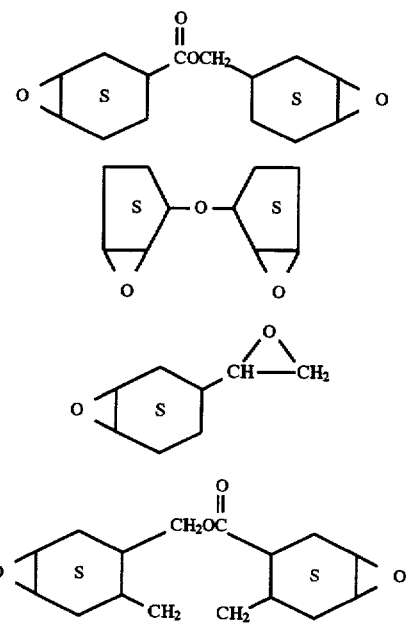

A distinguishing feature of many of the cycloalipahtic epoxides is the location of the epoxy group(s) on a ring structure rather than on an aliphatic side chain. Generally, the cycloaliphatic epoxides particularly useful in this invention will have the formula selected from the group consisting of:

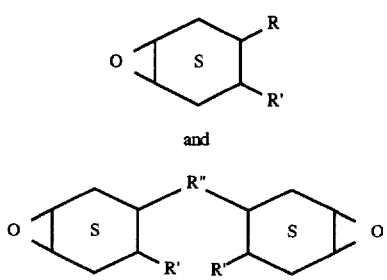

and where S stands for a saturated ring structure, R is selected from the group consisting of $CHOCH_2$, $O(CH_2)_nCHOCH_2$, and $OC(CH_3)_2CHOCH_2$ radicals, where n is 1 to 5, R' is selected from the group consisting of hydrogen, methyl, ethyl, propyl, butyl, and benzyl radicals and R" is selected from the group consisting of $CH_2OOC$ and $CH_2OOC(CH_2)_4COO$ radicals.

These cycloaliphatic epoxy resins may be characterized by reference to their epoxy equivalent weight, which is defined as the weight of epoxide in grams which contains one gram equivalent of epoxy. Suitable cycloaliphatic epoxy resins have a preferred epoxy equivalent weight of about 50 to about 250 grams per equivalent of epoxy. They will generally have a viscosity between about 5 to about 900 cp at 25 degrees C.

It is essential to the success of the present invention that the epoxide have a viscosity at 25 degrees C. of no greater than about 1000 centipoise, preferably about 300 to about 600 centipoise, and most preferably about 300 to about 450 centipoise.

Examples of cycloaliphatic epoxides are suggested in U.S. Pat. Nos. 3,207,357; 2,890,194; 2,890,197; and 4,294,746, the disclosures of which are hereby incorporated herein by reference. Some specific examples of suitable cycloaliphatic epoxides are 3,4-epoxycyclohexylmethyl-3,4-epoxycyclohexane carboxylate having the following structure:

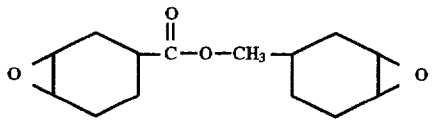

and available from Union Carbide under the trade designation ERL-4221; bis(3,4-epoxycyclohexyl)adipate, having the following structure:

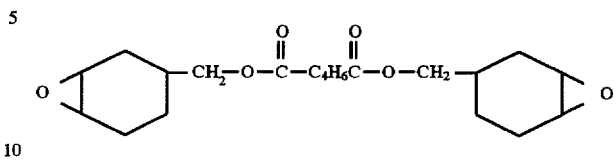

and available from Union Carbide under the trade designation ERL-4299; and vinyl cyclohexane diepoxide, having the following formula:

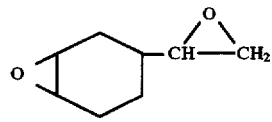

and available from Union Carbide under the trade designation ERL-4206.

A discussion of various cycloaliphatic epoxides can be found in the publication entitled "Cycloaliphatic Epoxide Systems," Union Carbide, 1970, the disclosure of which is hereby incorporated herein by reference. Mixtures of cycloaliphatic epoxides can be employed when desired. The preferred cycloaliphatic epoxide employed pursuant to the present invention is 3,4-epoxycyclohexylmethyl 3,4-epoxycyclohexane carboxylate (systematic name: 7-oxabicyclo (4,10) heptane-3-carboxylic acid 7-oxabicyclo (4,1) hept-3-ylmethyl ester).

Other suitable epoxy resins which can be incorporated in the present invention include, for example, those represented by the following formulas, I–IV:

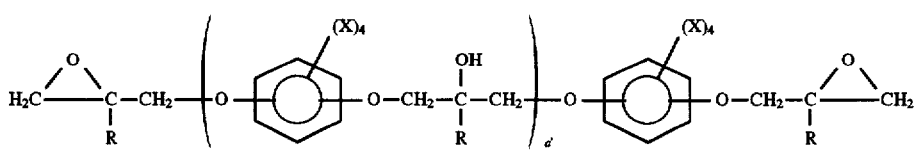

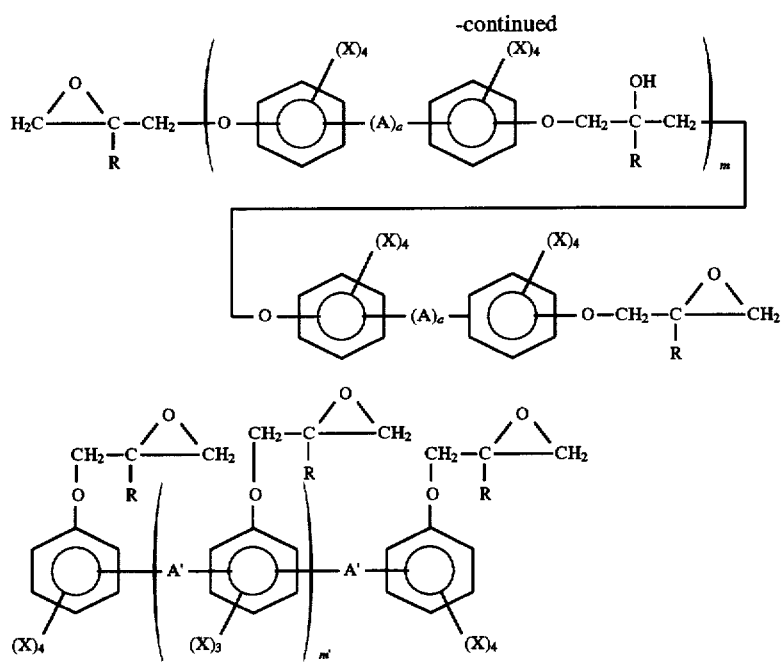

II.

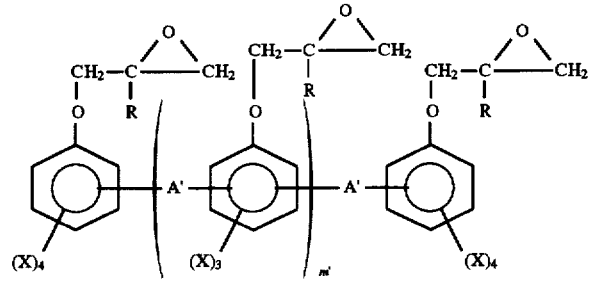

III.

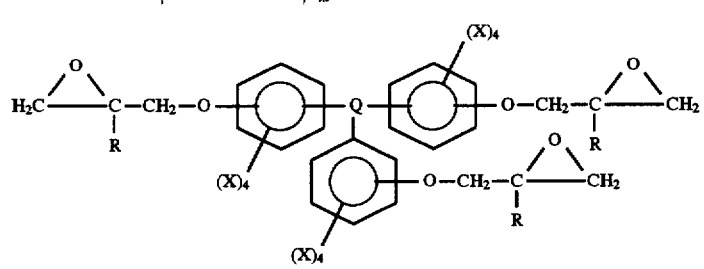

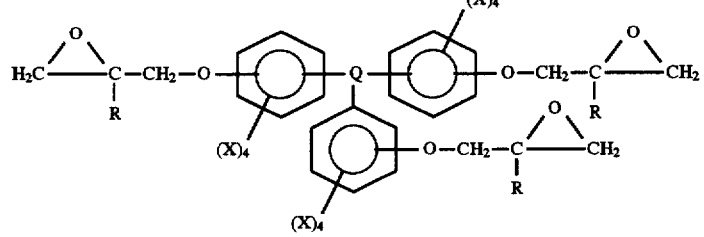

IV.

wherein each A is independently a divalent hydrocarbyl group having from 1 to about 9, and preferably from 1 to 4, carbon atoms, —O—, —SO$_2$—, or —CO—; each A' is independently a divalent hydrocarbyl group having from 1 to about 9, and preferably from 1 to 4 carbon atoms; Q is a hydrocarbyl group having from 1 to about 10 carbon atoms; Q' is hydrogen or an alkyl group having from 1 to about 4 carbon atoms; each X is independently hydrogen, bromine, chlorine, or a hydrocarbyl group having from 1 to about 9 and preferably from 1 to 4 carbon atoms; m has an average value of 0 to about 12, and preferable from about 0.03 to about 9, and most preferably from about 0.03 to about 3; m' has a value from about 0.011 to about 10, and preferably from about 0.05 to about 6; n has a value of 0 or 1; and n' has an average value from 0 to about 10, preferably from 0 to about 5, most preferably from about 0.1 to about 3.

Particularly suitable epoxy resins include, for example, the diglycidyl ethers of resorcinol, catechol, hydroquinone, biphenol, bisphenol A, tetrabromobisphenol A, phenol-aldehyde novolac resins, alkyl substituted phenol-aldehyde resins, bisphenol F, tetramethylbiphenol, tetramethyltetrabromophenol, tetramethyltetrabromophenol, tetrachlorobisphenol A, combinations thereof, and the like.

The cyanate esters that can be employed pursuant to the present invention have two or more —O—C≡N groups and are curable through cyclotrimerization.

The cyanate esters can be monomeric or less preferably polymeric, including oligomers and can be represented by those materials containing the following group:

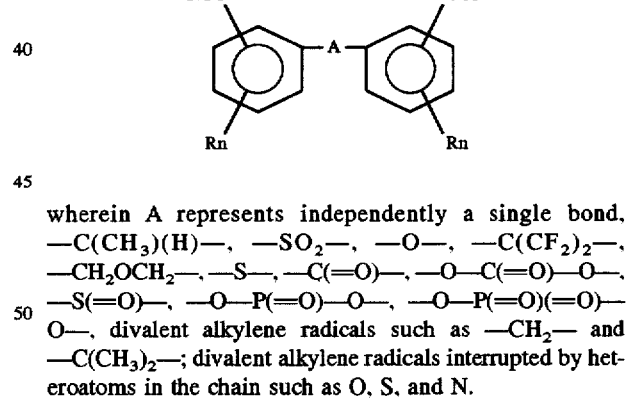

wherein A represents independently a single bond, —C(CH$_3$)(H)—, —SO$_2$—, —O—, —C(CF$_2$)$_2$—, —CH$_2$OCH$_2$—, —S—, —C(=O)—, —O—C(=O)—O—, —S(=O)—, —O—P(=O)—O—, —O—P(=O)(=O)—O—, divalent alkylene radicals such as —CH$_2$— and —C(CH$_3$)$_2$—; divalent alkylene radicals interrupted by heteroatoms in the chain such as O, S, and N.

Each R is independently selected from the group of hydrogen, alkyl containing 1 to 9 carbon atoms:

Each n independently is an integer of 0 to 4.

Other cyanates useful in the method, composition, and structure of the invention can be prepared by well known methods, for example, by reacting the corresponding polyvalent phenol with a halogenated cyanate, as described in U.S. Pat. Nos. 3,553,244; 3,740,348; and 3,755,402.

The phenol reactant can be any aromatic compound containing one or more reactive hydroxyl groups. The phenolic reactant is preferably a di- or tri-polyhydroxy compound of the formula:

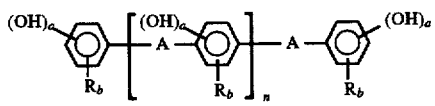

in which each a and b is independently 0, 1, 2, or 3, and at least one a is not 0; n is within the range of 0 to about 8, preferably 0 to 3; each R is independently selected from non-interfering alkyl, aryl, alkaryl, heteroatomic, heterocyclic, carbonyloxy, carboxy, and the like ring substituents, such as hydrogen, $C_{1-6}$ alkyl, $C_{1-6}$ allyl, $C_{1-6}$ alkoxy, halogen, maleimide, propargyl ether, glycidyl ether, and the like; and A is a polyvalent linking moiety which can be, for example, aromatic, aliphatic, cycloaliphatic, polycyclic, and heteroatomic. Examples of linking moiety A include —O—, —$SO_2$—, —CO—, —OCOO—, —S—, —$C_{1-12}$—, dicyclopentadienyl, aralkyl, aryl, cycloaliphatic, and a direct bond.

Specific cyanate esters that can be employed in the present invention are available and well-known and include those discussed in U.S. Pat. Nos. 4,195,132; 3,681,292; 4,740,584; 4,745,215; 4,477,629; and 4,546,131; European patent application EP0147548/82; and German Offen. 2611796, disclosures of which are incorporated herein by reference.

An example of a suitable polyaromatic cyanate ester containing cycloaliphatic bridging group between aromatic rings is available from Dow Chemical Company under the designation "Dow XU-71787.00L cyanate. A discussion of such can be found in Bogan, et al., "Unique Polyaromatic Cyanate Ester for Low Dielectric Printed Circuit Boards", Sampe Journal, Vol. 24, No. 6, November/December 1988. A preferred polyfunctional cyanate ester is Bisphenol AD dicyanate (4,4'-ethylidenebisphenoldicyanate) available from Ciba-Giegy Corporation under the trade designation AROCY L-10, hexafluoro bisphenol A dicyanate (Arocy-40S), and bisphenol M dicyanate (RTX366), having the formula

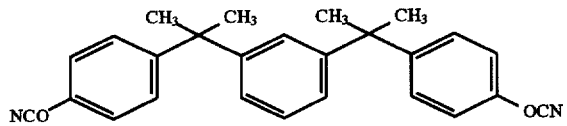

and commercially available from Ciba-Giegy Corporation.

The compositions employed pursuant to the present invention also include a filler and especially an inorganic filler. The particle size of the filler must not be greater than 31 microns or less, preferably about 0.7 to about 31 microns, and most preferably about 0.5 to about 20 microns. This is necessary so that the composition will readily flow in the gap between the chip and substrate carrier. The gap is normally about 25 to about 160 microns and preferably about 75 to about 125 microns. The preferred fillers have an average particle size of about 0.5 to about 20 microns.

The preferred filler can be optionally treated with a coupling agent, such as γ aminopropyltriethoxysilane (A1100) or β-(3,4-epoxycyclohexyl)ethyltrimethoxysilane (A186), or γ-glycidylpropyltrimethoxysilane (Z6040) from Dow-Corning. An amount of coupling agent which is about 0.25% by weight of filler has been found to be satisfactory. The amount can be determined by weight loss of filler treated with coupler after burning. The amount should be more than about a few monolayers.

Other thermally conductive and electrically insulating fillers could be used for improving the thermal heat transfer from the device to the surroundings. Such fillers include Aluminum Oxide, 92% Alumina, 96% Alumina, Aluminum Nitride, Silicon Nitride, Silicon Carbide, Beryllium Oxide, Boron Nitride and Diamond powder either high pressure or Plasma CVD. These fillers can be used in concentrations equivalent to fused silica and by incorporating them into suitable low viscosity thermosetting resins thermally conductive C4 encapsulating media could be realized.

Especially preferred fillers are aluminum oxide and aluminum nitride because of their high thermal conductivity.

The compositions of the present invention contain about 25 to about 80% by weight and preferably about 30 to about 60% by weight of the binder and correspondingly about 20to about 75% by weight and preferably about 40 to about 70% by weight of the filler. These amounts are based upon the total amounts of binder and filler in the composition. When the binder includes the polyepoxide, the compositions employed in the present invention also include a hardening or curing agent. The preferred hardeners for the polyepoxides are the anhydrides of organic carboxylic acids. The hardening agent is preferably in liquid form. If a solid hardening agent is employed, such should be melted when added to the composition. Examples of anhydrides are methyltetrahydrophthalic anhydride; hexahydrophthalic anhydride; maleic anhydride, trimellitic anhydride; pyromellitic dianhydride, tetrahydrophthalic anhydride; phthalic anhydride; norbornenedicarboxylic anhydride; nadic methyl anhydride; and methylcyclohexane-1,2-dicarboxylic anhydride.

Additional anhydrides can be found, for instance, in H. Lee and K. Neville, Handbook of Epoxy Resin, McGraw Hill, 1967, Chapter 12, disclosure of which is incorporated herein by reference.

The anhydride curing agent is generally employed in amounts constituting on an equivalent basis, about 20% to about 120% of the cycloaliphatic epoxide employed and preferably about 75% to about 100% of the epoxide equivalents.

Preferably the curing agent is employed in amounts of about 89 to about 110 parts by weight per hundred parts of polyepoxy (phr).

In addition to the binder and filler, the compositions can also include a catalyst to promote the polymerization of the epoxy and/or cyanate ester.

Suitable catalysts for the epoxy include amines such as the imidazoles, tertiary amine benzyldimethylamine, 1,3-tetramethyl butane diamine, tris (dimethylaminomethyl) phenol, pyridine, and triethylenediamine, and acidic catalysts, such as stannous octoate.

Suitable catalysts for the cyanate ester include Lewis acids, such as aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, manganese, iron, zinc, and copper acetylacetonate or octoates or naphthenates. The amount of catalyst when used can vary, and generally will be 0.005 to 5 weight percent, preferably 0.05 to 0.5 weight percent based on total solid binder weight.

Surfactants in amounts of about 0.5% to about 3% and preferably about 1.2% to about 1.6% can be used to facilitate mixing the filler with the epoxy. Suitable surfactants include silanes and non-ionic type surface active agents, such as Triton X-100 from Rohm and Haas Co.

Surfactants are generally prepared by the reaction of octylphenol or nonylphenol with ethylene oxide, and have the following general structural formulae, respectively:

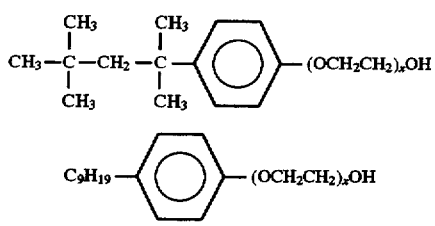

in which the $C_9$ alkyl group is a mixture of branched chain isomers and x is the average number of ethylene oxide units in the ether side chain.

In the compositions that employ a cycloaliphatic epoxide, it is preferred to also employ small amounts of a reactive modifier, i.e., a flexibilizer. The purpose of the reactive modifier is to impart desirable mechanical properties to the cured composition, such as flexibility and thermal shock resistance. Examples of modifiers which can be used are fatty acids, fatty acid anhydrides, diols, polyols, polyetherdiols, and other materials having dihydroxyl groups, carboxyl, epoxy, and/or carboxylic anhydride functionality. One preferred modifier is ethylene glycol which, when employed, is present in amounts of about 0.7 to about 2 phr (per hundred parts by weight of the epoxy). Ethylene glycol is employed as a source of hydroxyls to promote the reaction of anhydride with the epoxy.

It has been found that a preferred composition for crack-resistant encapsulants is the product of a mixture of ethylene glycol and about 5 to about 30 percent, and preferably about 10 percent polyol flexibilizer. Polyol is a polyhydric alcohol containing three or more alcohol groups. The preferred polyol is one having a molecular weight between about 700 and 6,000. Polyether polyols are also satisfactory.

The preferred compositions of the present invention also include an organic dye in amounts less than about 0.2% to provide contrast. Suitable dyes are nigrosine and Orasol blue GN.

The preferred compositions employed pursuant to the present invention are substantially free (e.g.—less than 0.2% by weight) if not completely free from non-reactive organic solvents. Compositions employed pursuant to the present invention have viscosity at 25° C. (Brookfield cone & plate Spindle 51, 20 RPM or equivalent) of about 3,000 to about 17,000 centipoise and preferably about 3,000 to about 10,800 centipoise. The compositions are stable for at least 12 hours. The compositions can be cured at temperatures of less than about 200° C. and preferably about 130° C. to about 180° C. in about 2 to about 6 hours and preferably about 4 to 5 hours. The cured compositions have coefficient of thermal expansion of about 25 to about 40 ppm/° C., glass transition temperature of greater than about 130° C. and preferably about 140° to about 190° C. The cured compositions have Shore D hardness of greater than 85 and preferably greater than 90, modulus of elasticity at 25° C. of greater than 250,000 psi and preferably greater than 750,000 psi; volume resistivity at 25° C. of greater than $10^{13}$ oh-cm and preferably greater than $10^{14}$ oh-cm.

The compositions are prepared by rapidly admixing the components under vacuum usually about 5 mm Hg either using a double planetary mixer or high shear mixer to provide better and homogenous compositions.

The composition is applied by dispensing through nozzles under pressure of about 15 to about 90 psi and temperatures of about 25° to about 40° C. The compositions completely cover the C4 connections and pin heads. If desired, the compositions can be pregelled by heating for about 15 to about 60 minutes, typically about 30 minutes at about 75° to about 100° C.

The compositions are then cured by heating to about 130° to about 200° C. and preferably about 130° to about 180° C. for about 2 to about 6 and preferably about 2 to about 4 hours. The substrate employed can be an organic, inorganic or composite in nature. The preferred substrate can be a ceramic module or a multilayer printed circuit board, including a printed circuit board with a conductive metal core. The preferred ceramic substrates include silicon oxides and silicates such as aluminum silicate, and aluminum oxides. High heat transfer substrates, such as aluminum nitride substrates, may also be used.

The preferred organic substrates, either rigid or flexible, as in printed circuit boards, include conventional FR-4 epoxy and laminates based on high temperature resins such as high temperature epoxies, polyimides, cyanates (triazines), fluoropolymers, benzocyclobutenes, polyphenylenesulfide, polysulfones, polyetherimides, polyetherketones, polyphenylquinoxalines, polybenzoxazoles, and polyphenyl benzobisthiazoles.

The chip carrier employed can be a flexible or rigid organic, inorganic, or composite material. Substrates having thin film redistribution layers may also be used. The preferred substrate can be a ceramic module or a multilayer printed circuit board. The preferred ceramic substrates include silicon oxides and silicates, such as aluminum silicate and aluminum oxides.

Exemplary fluoropolymers include perfluoroalkylenes, as polytetrafluoroethylene, copolymers of tetrafluoroethylene and hexafluoropropylene, copolymers of tetrafluoroethylene and perfluoro-2,2-dimethyl-1,3-dioxide, polytrifluorochloroethylene, copolymers of tetrafluoroethylene with olefins as ethylene, copolymers of trifluorochloromethane with olefins as ethylene, and polymers of perfluoroalkyl vinyl ether. Some commercially available fluoropolymers include polytetrafluoroethylene, tertafluoroethylene-perfluoroalkoxy, tetrafluoroethylene-ethylene, chlorotrifluoroethylene-ethylene, chlorotrifluoroethylene, and tetrafluoroethylene-perfluoro-2,2-dimethyl-1,3 dioxide.

Commercially available fluorocarbon polymers reinforced with fiber glass particulates are available from the Rogers Corporation under the trade designation RO2800 and RO2500.

The polyimides that can be used as substrates in accordance with the present invention include unmodified polyimides, as well as modified polyimides such as polyester imides, polyamide-imide-esters, polyamide-imides, polysiloxane-imides as well as other mixed polyimides. Such are well known in the prior art and need not be described in great details.

Generally, the polyimides include the following recurring unit:

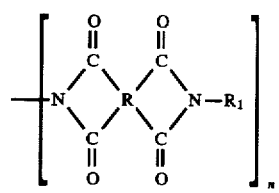

where n is an integer representing the number of repeating units to provide a molecular weight usually about 10,000 to about 100,000. R is at least one tetravalent organic radical selected from the group consisting of:

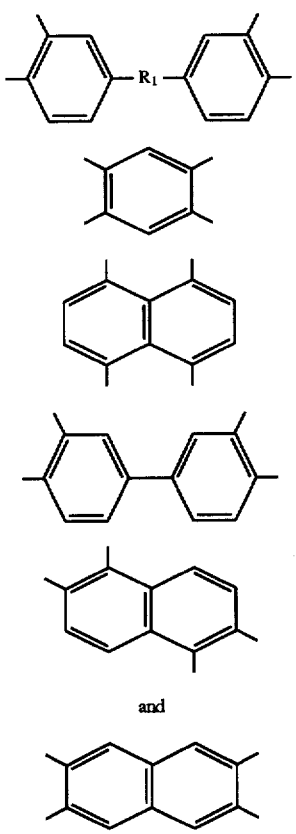

in which R1 is a least on divalent radical selected from the group consisting of:

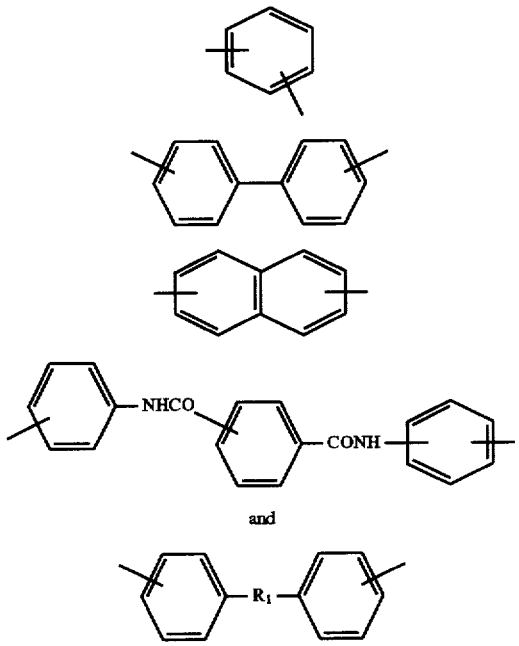

in which R1 is a divalent organic radical selected from the group consisting of divalent aliphatic hydrocarbon radicals having from 1 to 4 carbon atoms and carbonyl, oxy, sulfo, hexafluoroisopropylidene and sulfonyl radicals, silicon, and amino radicals. Polymers containing two or more of the R and/or R1 radicals, especially multiple series of R1 containing amido radicals can be used.

Commercially available polyimide precursors (polyamic acid) are various polyimide precursors from DuPont and available under the designation Pyralin. These polyimide precursors come in many grades, including those available Pyralin polyimide precursors from DuPont under the further trade designations PI-255, PI-2545, PI-2560, PI-5878, PHI-61454, and PI-2540. Some of these are pyromellitic dianhydride-oxydianiline (PMDA-ODA) polyimide precursors.

Commercially available chemically cured polyimides are various polyimides from DuPont and available under the trade designation Kapton, V-Kapton, HN-Kapton, and VN-Kapton, which are all chemically cured polyimides are generally cured with an anhydride curing agent such as acetic anhydride. Other commercially available polyimides having relatively lower thermal expansion are the polyimides under the Trade designation Upilex-R and Upilex-SGA from Ube Industries.

Typical epoxy resins include the bisphenol A type resins obtained from bisphenol A and epichlorohydrin, resinous materials obtained by the epoxidation of novolak resins produced from a phenol and an aldehyde such as formaldehyde with epichlorohydrin, polyfunctional epoxy resins such as tetraglycidyldiaminodiphenyl methane and allcyclic epoxy resins such as bis(3,4-epoxy-6-methylcyclohexylmethyl)adipate. The most preferred epoxy employed is the bisphenol A type.

The epoxy resinous compositions also can contain accelerators and curing agents as well known in the art. Examples of suitable curing agents include polyamines, primary, secondary, and tertiary amines, polyamides, polysulfides, ureaphenol-formaldehyde, and acids or anhydrides thereof. In addition, suitable curing agents include Lewis acid catalysts such as $BF_3$ and complexes thereof.

Many of the organic substrates employed in accordance with the present invention contain the resin and a reinforcing fiber such as fiber-glass. Such compositions containing fibers are usually prepared by impregnating the fibers with, for instance, a composition of the polymer. The amount of the polymer composition is usually about 30% to about 70% by weight and preferably about 50% to about 65% by weight of the total solids content of the polymer composition in the fiber-glass.

In the case of epoxy compositions such can be prepared by combining with the reinforcing fibers, and then curing to the B-stage and cutting to the desired shape such as a sheet. When sheets are employed, the thickness is usually about 1.5 mils to about 8 mils. The curing to the B-stage is generally achieved by using temperatures of about 80° C. to about 110° C. for about 3 minutes to about 10 minutes. If desired, the substrate can then be laminated onto other substrates as well as being interposed between the above electrically conductive patterns present in the support layers.

The laminating can be carried out by pressing together the desired structure in a preheated laminating press at a predetermined pressure and temperature as, for example, about 200 psi to about 500 psi and preferably abut 250 psi to about 300 psi at about 180° C. The time of the pressing operation is variable depending upon the particular materials employed and the pressure applied. About 1 hour is adequate for the above conditions.

The organic substrates include the desired electrically conductive circuitry on the top and/or bottom surfaces of the substrate and/or non interior planes of the substrate as well known.

Next, in order to connect the electrically conductive patterns on opposing surfaces of the dielectric material, through-holes in the structure can be made. The through-holes can be obtained by drilling or punching operations including mechanical drilling and laser drilling and subsequently plated. The organic substrates are generally abut 3 to about 300 mils thick and more usually about 40 to about 100 mils thick.

The following non-limiting examples are presented to further illustrate the present invention.

EXAMPLE 1

A composition containing about 30.05 parts by weight of 3,4-epoxycyclohexylmethyl-3,4-epoxycyclohexane carboxylate (Union Carbide ERL-4221), about 30.02 parts by weight of hexahydrophthalic anhydride; about 0.3 parts by weight of benzyl dimethyl amine, about 0.6 part by weight of ethylene glycol, about 1.90 parts by weight of Triton X-100 surfactant from Rohm & Haas was prepared and designated as mixture A. Compositions containing various amounts of ultra high purity Aluminum Nitride purchased from ICD Group,. Inc., 641 Lexington Avenue, New York, N.Y. were made and cured at 130° C. for 4 hours. The resulting properties are presented in Table I.

TABLE I

| Weight mixture A | Weight of AlN | Viscosity (cps) | CTE (ppm/°C.) | Tg (°C.) |
|---|---|---|---|---|
| 13.5 (A1) | 1.5 | 675 | 61.2 | 145 |
| 12.0 (A2) | 3.0 | 1,330 | 55.3 | 144 |
| 10.5 (A3) | 4.5 | 3,000 | 52.1 | 150 |
| 9.0 (A4) | 6.0 | 17,000 | 42.4 | 147 |
| 7.5 (A5) | 7.5 | — | 40.4 | 139 |

A sample taken from composition A4 is dispensed at a temperature of about 30° C. in the gap of about 5 mils between a silicon chip soldered by solder bumps to 36 mm by 36 mm $Al_2O_3$ substrate having pins protruding therefrom. The composition is cured at about 140° C. in about 2 hours. The composition after being cured has a coefficient of thermal expansion of less than 42×10–6/° C. The composition covers well the solder connections.

EXAMPLE 2

Compositions containing various amounts, as presented in Table II, of Bisphenol AD dicyanate available from Ciba-Giegy Corporation as Arocy-L10 and Aluminum Nitride available from ICD Group Inc., and about 0.2 parts by weight of Zinc Octanoate (8% Zinc in mineral spirits ) are prepared. The resulting viscosities from incorporating such filler in the liquid cyanates are shown in Table II.

TABLE II

| Weight of Resin | Weight of AlN | Viscosity (cps) |
|---|---|---|
| 13.5 (B1) | 1.5 | 123 |
| 12.0 (B2) | 3.0 | 266 |
| 10.5 (B3) | 4.5 | 2,100 |
| 9.0 (B4) | 6.0 | 14,500 |
| 7.5 (B5) | 7.5 | 19,900 |
| 6.8 (B6) | 8.2 | — |

Composition B5 can be easily dispensed at a temperature of about 50° C. in the gap of about 5 mils between a silicon chip soldered by solder bumps to 28×28 mm $Al_2O_3$ substrate having pins protruding therefrom. The composition after being cured at 200° C. in about 2 hours has a glass transition temperature of about 220° C., and a coefficient of thermal expansion of less than 35×10–6/° C.

EXAMPLE 3

A composition containing about 13 parts by weight of 3,4-epoxycyclohexylmethyl-3,4-epoxycyclohexane carboxylate (Union Carbide ERL-4221), about 54 parts by weight of aluminum oxide available from Atlantic Equipment Engineers, about 12 parts by weight of methylhexahydrophthalic anhydride; about 0.3 parts by weight of benzyl dimethyl amine, about 0.26 part by weight of ethylene glycol, about 0.8 parts by weight of Triton X-100 surfactant from Rohm & Haas and about 0.03 parts by weight of Spectrasol Black CN was prepared.

The composition was dispensed at a temperature of about 30° C. in the gap of 5 mils between a silicon chip soldered by solder bumps to a 28 mm by 28 mm $Al_2O_3$ substrate having pins producing therefrom. The composition was cured at about 130° C in about 4 hours. The composition covered the pin heads and solder bumps.

While the invention has been described with respect to certain preferred embodiments and exemplifications, it is not intended to limit the scope of the invention thereby, but solely by the claims appended hereto.

What is claimed is:

1. A method of increasing the fatigue life of solder interconnections between a semiconductor device and a supporting substrate comprising attaching said device to said substrate by a plurality of solder connections that extend from the supporting substrate to electrodes on said semiconductor device to form a gap between said supporting substrate and said semiconductor device;

filling said gap with a composition that contains:
   A. binder selected from the group of a cycloaliphatic epoxide, cyanate ester, prepolymer of cyanate ester and mixtures thereof, said binder having a viscosity at room temperature of no greater than about 5,000 centipoise;
   B. filler chosen from the group consisting of aluminum oxide, aluminum nitride, silicon nitride, silicon carbide, beryllium oxide, boron nitride, and diamond powder, said filler having a maximum particle size of 31 microns; wherein the amount of A is about 60 to about 25 percent by weight of the total of A and B, and correspondingly the amount of B is about 40 to about 75 percent by weight based upon the amount of A and B; and curing said composition.

2. The method of claim 1 wherein said gap is about 15 to about 160 microns wide.

3. The method of claim 1 wherein said binder is a polyepoxide selected from the group of 3,4-epoxycyclohexylmethyl-3,4-epoxycyclohexane carboxylate and vinyl cyclohexane diepoxide.

4. The method of claim 1 wherein said binder includes 3,4-epoxycyclohexylmethyl-3,4-epoxycyclohexane 3 carboxylate.

5. The method of claim 1 wherein the viscosity of said binder at 25° C. is about 35 to about 500 centipoise.

6. The method of claim 1 wherein said filler is aluminum nitride.

7. The method of claim 1 wherein said filler has particle sizes of about 0.5 to about 31 micrometers.

8. The method of claim 1 wherein said amount of said binder is about 25–60% by weight and said amount of said filler is correspondingly about 40–75% by weight.

9. The method of claim 1 wherein said composition includes an anhydride of an organic carboxylic acid hardener.

10. The method of claim 9 wherein said hardener includes hexahydrophthalic anhydride or methyl hexahydrophthalic anhydride or mixtures thereof.

11. The method of claim 9 wherein the amount of the hardener is about 89 to about 110 phr.

12. The method of claim 9 wherein the viscosity at 25° C. of said composition is about 1,500 to about 30,000 centipoise.

13. The method of claim 1 wherein said composition also includes a catalyst.

14. The method of claim 1 wherein said composition also includes ethylene glycol in an amount of about 0.5 to about 2 phr.

15. The method of claim 1 wherein said composition is free of unreactive organic solvents.

16. The method of claim 1 wherein said composition also includes an adhesion promoter.

17. The method of claim 1 wherein the composition contains coupling agent.

18. The method of claim 17 wherein the coupling agent is selected from the group consisting of γ-amino propyl triethoxy silane, β-(3,4,-epoxy cyclohexyl) ethyltrimethoxy silane, and γ-glycidoxy propyltrimethoxy silane.

19. The method of claim 17 wherein the coupling agent is present in an amount which is about 0.25% by weight to about 2% by weight of the binder.

20. The method of claim 1 wherein said substrate is an organic, inorganic or a composite material.

21. The method of claim 1 wherein said binder is a cyanate ester.

22. The method of claim 1 wherein said cyanate ester is chosen from the group consisting of 4,4'-ethylidene bisphenol dicyanate, bisphenol-M dicyanate, bisphenol-P dicyanate, hexafluorobisphenol A dicyanate, and mixtures thereof.

23. The method of claim 1 wherein the substrate is an organic substrate.

24. The method of claim 23 wherein the organic substrate comprises a material chosen from the group consisting of FR-4 epoxy, polyimides, cyanates (triazines), fluoropolymers, benzocyclobutenes, polyphenylenesulfide, polysulfones, polyetherimides, polyetherketones, polyphenylquinoxalines, polybenzoxazoles, and polyphenyl benzobisthiazoles.

* * * * *